(12) United States Patent
Schwab et al.

(10) Patent No.: US 8,139,231 B2
(45) Date of Patent: Mar. 20, 2012

(54) MACHINE VISION TECHNIQUE FOR MANUFACTURING SEMICONDUCTOR WAFERS

(75) Inventors: John W. Schwab, Framingham, MA (US); Gang Liu, Natick, MA (US); David J. Michael, Wayland, MA (US)

(73) Assignee: Cognex Corporation, Natick, MA (US)

( * ) Notice: Subject to any disclaimer, the term of this patent is extended or adjusted under 35 U.S.C. 154(b) by 993 days.

(21) Appl. No.: 12/113,492

(22) Filed: May 1, 2008

(65) Prior Publication Data

US 2009/0274361 A1 Nov. 5, 2009

(51) Int. Cl.
G01B 11/14 (2006.01)
(52) U.S. Cl. ........................................................ 356/614
(58) Field of Classification Search .................. None
See application file for complete search history.

(56) References Cited

U.S. PATENT DOCUMENTS

| | | | |
|---|---|---|---|
| 4,076,420 A * | 2/1978 | De Maeyer et al. ............ 356/73 |
| 4,238,780 A | 12/1980 | Doemens | |
| 4,391,505 A | 7/1983 | Silverberg | |
| 4,697,075 A | 9/1987 | Roos et al. | |
| 4,714,347 A * | 12/1987 | Cole ............................ 356/339 |
| 4,803,735 A | 2/1989 | Nishida et al. | |
| 4,924,086 A | 5/1990 | Webber | |
| 4,969,037 A | 11/1990 | Poleschinski et al. | |
| 5,048,094 A | 9/1991 | Aoyama et al. | |
| 5,365,672 A | 11/1994 | Kato | |
| 5,367,439 A | 11/1994 | Maver et al. | |
| 5,371,690 A | 12/1994 | Engel et al. | |
| 5,381,004 A | 1/1995 | Uritsky et al. | |
| 5,497,007 A | 3/1996 | Uritsky et al. | |
| 5,585,917 A | 12/1996 | Woite et al. | |
| 5,659,396 A | 8/1997 | Mondie | |
| 5,739,913 A | 4/1998 | Wallace | |
| 5,835,223 A | 11/1998 | Zwemer et al. | |
| 5,953,130 A | 9/1999 | Benedict et al. | |
| 5,978,081 A | 11/1999 | Michael et al. | |
| 5,982,132 A | 11/1999 | Colby | |
| 6,025,905 A | 2/2000 | Sussman | |
| 6,166,505 A | 12/2000 | Sato | |
| 6,170,973 B1 | 1/2001 | Benedict | |
| 6,191,850 B1 | 2/2001 | Chiang | |
| 6,275,742 B1 | 8/2001 | Sagues et al. | |
| 6,341,878 B1 | 1/2002 | Chiang | |
| 6,900,877 B2 | 5/2005 | Raaijmakers | |
| 6,914,679 B2 | 7/2005 | Nettekoven et al. | |
| 6,933,172 B2 | 8/2005 | Tomimatsu | |
| 7,042,568 B2 | 5/2006 | Mayo | |
| 7,048,400 B2 | 5/2006 | Murasko et al. | |
| 7,106,425 B1 * | 9/2006 | Bultman et al. ................ 356/73 |

(Continued)

*Primary Examiner* — Gregory J Toatley
*Assistant Examiner* — Amanda Merlino
(74) *Attorney, Agent, or Firm* — Quarles & Brady LLP

(57) ABSTRACT

A vision system is provided to determine a positional relationship between a photovoltaic device wafer on a platen and a printing element, such as a printing screen, on a remote side of the photovoltaic device wafer from the platen. A source emits ultraviolet light along a path that is transverse to a longitudinal axis of an aperture through the platen, and a diffuser panel is located along that path. A reflector directs the light from the diffuser panel toward the aperture. A video camera is located along the longitudinal axis of the aperture and produces an image using light received from the platen aperture, wherein some of that received light was reflected by the wafer. A band-pass filter is placed in front of the camera to block ambient light. The use of diffused ultraviolet light enhances contrast in the image between the wafer and the printing element.

31 Claims, 1 Drawing Sheet

U.S. PATENT DOCUMENTS

| | | |
|---|---|---|
| 7,119,908 B2 * | 10/2006 | Nomoto et al. ............... 356/504 |
| 7,225,734 B2 | 6/2007 | Schanz |
| 7,295,314 B1 | 11/2007 | Spady et al. |
| 2005/0166772 A1 | 8/2005 | Schanz |
| 2006/0194123 A1 | 8/2006 | Mickan et al. |
| 2009/0274361 A1 | 11/2009 | Schwab et al. |

* cited by examiner

MACHINE VISION TECHNIQUE FOR MANUFACTURING SEMICONDUCTOR WAFERS

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The present invention relates to processes and equipment for manufacturing a photovoltaic device; and more particularly to apparatus and methods for aligning a component of the manufacturing equipment with a wafer of material on which the photovoltaic device is being fabricated.

2. Description of the Related Art

Photovoltaic devices, such as solar cells are fabricated on a wafer of silicon or other material. Various sections of the wafer are electrically interconnected by a pattern of silver or other conductive material deposited on a surface of the wafer. Typically, a screen printing process, similar to silk screen printing element, is employed to deposit the silver in the proper pattern on the wafer surface. The printing screen used in that deposition process must be precisely aligned with the wafer in order that the silver conductive pattern is properly registered with the semiconductor devices.

Machine vision systems are commonly used in semiconductor device processing. In such systems, a video camera produces an image of the semiconductor wafer and that image is then analyzed for various purposes, such as defect detection. In other situations, the wafer image is utilized to determine whether the wafer is properly positioned on a work surface of a processing apparatus.

Difficulty has been encountered when attempting to utilize conventional machine vision systems to align the printing screen used to deposit the conductive pattern on a photocell wafer. Conventional illumination techniques did not provide sufficient contrast between the wafer and the printing screen to enable the vision system to reliably and accurately detect the edges of the wafer. Both the printing screen and the wafer reflected visible light similarly, which adversely affected the ability to distinguish between those objects. An alternative proposal involved backlighting the printing screen, however placing a light source on the remote side of the printing screen from the wafer interfered with the printing process.

As a consequence, it is desirable to develop an alternative machine vision technique for use with automatic registration between a wafer and the printing screen.

SUMMARY OF THE INVENTION

A vision system is provided to determine a positional relationship between a photovoltaic device wafer on a platen and a printing element, such as a screen, on a remote side of the wafer from the platen. An aperture having a longitudinal axis extends through the platen. A source emits ultraviolet light along a path that preferably is transverse to the longitudinal axis of the aperture, and a diffuser assembly is located along that path to direct the ultraviolet light into the aperture. A video camera is positioned along the longitudinal axis of the aperture and produces an image using light received from the aperture wherein some of that light was reflected by the wafer.

Use of diffused ultraviolet light enhances contrast in the image between the wafer and the printing element.

In a preferred embodiment of the vision system, a filter is located between the platen and the camera to transmit the ultraviolet light while blocking ambient light.

In the preferred embodiment a window is located at the surface of the platen to transmit the ultraviolet light while blocking ambient light.

DETAILED DESCRIPTION OF THE INVENTION

Although the present invention has particular application for use with equipment for processing photovoltaic device wafers, the vision system has applicability for use in fabricating other types of semiconductor wafers and devices. Furthermore, while the present vision system is being described in the context of an apparatus for printing conductive material on a semiconductor wafer, it can be employed with other kinds of equipment.

Figure 1:
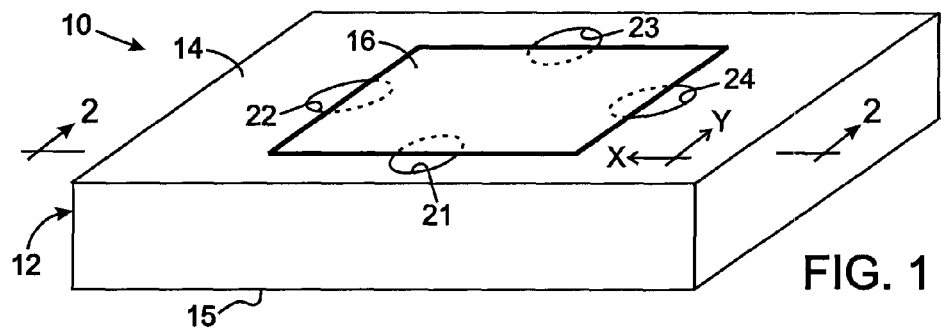
FIG. 1 is an isometric view of part of a printing apparatus showing a platen with a photovoltaic device wafer thereon.

With initial reference to FIG. 1, an apparatus 10 is employed to apply a conductive pattern of silver to a wafer on semiconductive material in which a photovoltaic device is being fabricated. The apparatus 10 has a platen 12 with a top surface 14 on which the photovoltaic device wafer 16 is positioned. The exemplary wafer 16 is rectangular, although the present technique can be used with wafers of other shapes by modifying the machine vision system to accommodate such shapes. Four circular viewing apertures 21, 22, 23, and 24 extend through the platen 12 between the opposite top and bottom surfaces 14 and 15. The viewing apertures 21-24 are located so that when the photovoltaic device wafer 16 is centrally positioned on the top surface 14, edges of the wafer bisect an opening of each viewing aperture 21-24. However, during the fabrication operation, the photovoltaic device wafer 16 does not have to be positioned to precisely bisect each aperture opening, but can be offset on the top surface along either or both of the X and Y orthogonal axes. A rotational offset also may occur.

Figure 2:
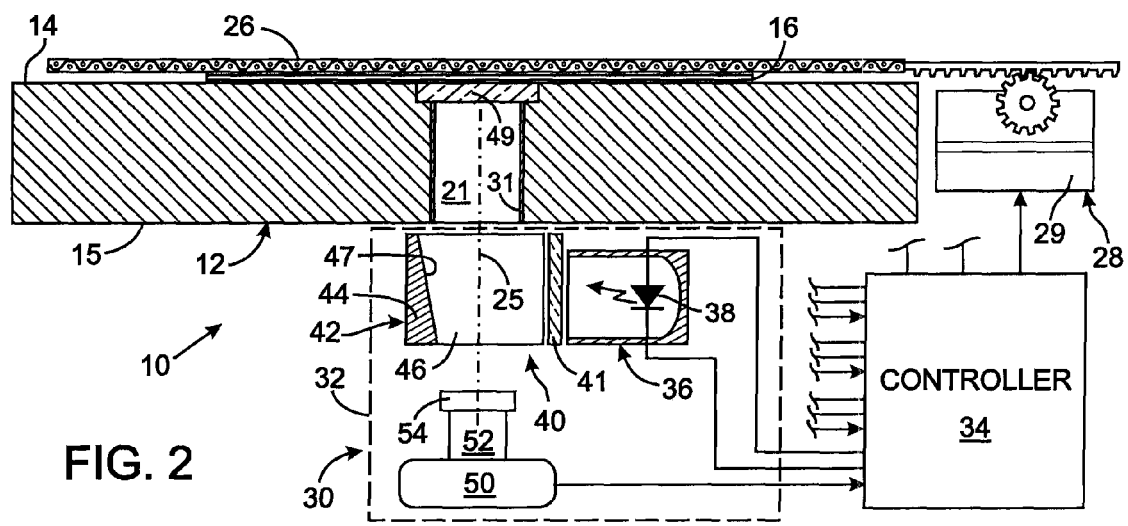
FIG. 2 is a cross sectional view along line 2-2 in FIG. 1 illustrating a machine vision system incorporated with the printing element printing apparatus.

As shown in FIG. 2, after the photovoltaic device wafer 16 is placed on the top surface 14 of the platen 12, a printing element 26 is positioned against the major surface of the photovoltaic device wafer 16 that is remote from the platen 12. The printing element 26 is of a type that has been used in previous processes to apply material in a pattern on a wafer surface and include, but are not limited to, a printing screen, a stencil, a mask used in a lithographic process, and an ink jet head at an datum position. Nor is the present invention limited to equipment for depositing conductive material on a wafer. The location of the printing element 26 along the X and Y axes, as shown in FIG. 1, is controlled by a positioning mechanism 28 that employs two separate actuators 29 for independently moving the printing element along each axis. A third actuator may be provided to rotate the printing element with respect to the wafer. Only one of those actuators 29 is visible in FIG. 2 and is schematically represented as a motor that drives a rack and pinion mechanism, however, any conventional mechanism for positioning the printing element can be employed.

The positioning mechanism 28 is controlled by a machine vision system 30 that utilizes four camera modules 32, one associated beneath each viewing aperture 21-24 in the platen 12. The camera module 32 associated with the first viewing aperture 21 will be described in detail, with the understanding that the same description applies to the other three camera modules. Each camera module 32 is connected to a conventional machine vision controller 34, which uses images received from the four camera modules 32 to determine the position of the printing element 26 with respect to the photovoltaic device wafer 16.

Figure 3:
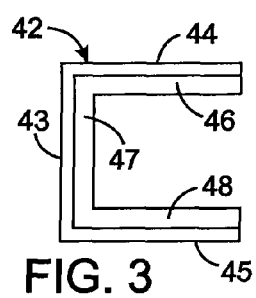
FIG. 3 illustrates a light reflector used in the machine vision system.

The camera module 32 includes an ultraviolet light source 36 that has a light emitting diode (LED) 38, although other types of emitters can be used. Preferably, the LED 38 emits light that has a wavelength less than 410 nm, preferably in the 365-410 nm range, and in particular 365 nm or 396 nm, although other wavelengths within the ultraviolet spectrum can be utilized. An important aspect of the machine vision system 30 is that the light emitted by the LED 38 is diffused significantly before entering the viewing aperture 21 in the platen 12. For that purpose, the light emitted by the LED 38 is directed along a path that is perpendicular to the longitudinal axis 25 of the aperture 21 and travels through a diffuser assembly 40 located beneath the opening of the viewing aperture 21 in the bottom surface 15 of the platen 12. The diffuser assembly 40 comprises a conventional diffuser panel 41 between the light source 36 and an opening of a reflector 42. The diffuser panel 41 is transparent to light and spreads the light rays passing there through into fairly uniform diffuse light. The diffuser panel 41 can include a variety of translucent surface finishes to generate a diffuse profile including frosting, diamond patterns and the like. With additional reference to FIG. 3 which depicts a view looking toward the reflector 42 from the platen 12, that reflector has first, second and third walls 43, 44, and 45, respectively, arranged in a U-shape with the opening of the U facing toward the light source 36. The inside surfaces 46, 47 and 48 of the three walls are highly reflective to direct the light toward the viewing aperture 21 in random directions thereby further diffusing that light. The top and bottom of the reflector 42 are open thereby enabling the light to travel upward into the associated viewing aperture 21 in the platen 12. The platen is fabricated of aluminum with the interior surface of the circular viewing aperture 21 plated with a nickel coating 31 to increase the reflectivity of that surface. That reflective coating aids in directing the light in a diffused manner through the viewing aperture 21 toward the photovoltaic device wafer 16. A window 49 is located at the opening of the viewing aperture 21 through the top surface 14 of the platen 12. The window 49 comprises a body of a material that is transparent to the ultraviolet wavelengths produced by the light source 36 and has surface coatings that are anti-reflective to those wavelengths.

A conventional charge coupled device or a CMOS camera 50, that has sensitivity to the ultraviolet light used, is positioned beneath the reflector 42 with a lens 52 aimed toward the viewing aperture 21 and thus the bottom surface of the photovoltaic device wafer 16. A narrow band-pass filter 54 is located between the lens 52 and the reflector 42. The pass band of the filter 54 includes the wavelength of the ultraviolet light from the source 36, but excludes ambient light wavelengths. Specifically, the band-pass filter 54 blocks visible light from the environment of the photovoltaic device wafer processing apparatus 10 from entering the camera 50. Thus the camera 50 only receives ultraviolet light and primarily that light which is produced by source 36.

During fabrication of a photovoltaic device wafer, the photovoltaic device wafer 16 is placed onto the top surface 14 of the platen 12. The controller 34 then activates the light sources 36 in the four camera modules 32 associated with the viewing apertures 21-24 in the platen. Alternatively, the light sources 36 can be supplied with electricity via a manual switch, that is not operated by the controller 34. With continuing reference to FIG. 2, the operation of one camera module 32 will be described with the understanding that the same operation occurs in the other three camera modules 32. The activation causes the light emitting diode 38 to emit ultraviolet light which passes through the diffuser panel 41 into the reflector 42, thereby diffusing the ultraviolet light and directing a substantial portion of that light into the associated viewing aperture 21. The light continues to be reflected at various angles by the wall of the viewing aperture 21 and, after passing through the window 49, strikes a portion of the bottom surface of the photovoltaic device wafer 16 that extends over the viewing aperture 21. Because the light is diffused by the diffuser assembly 40 and the reflective surfaces of viewing aperture 21, the light rays strike the bottom surface of photovoltaic device wafer 16 at acute angles and not perpendicular to the bottom surface. The acute angles of incidence cause a significant amount of the light to be reflected back into the associated aperture 21 in the platen 12.

Some of the ultraviolet light travels through an exposed portion of the viewing aperture 21 (i.e. a portion not covered by the wafer in FIG. 1) and strikes the printing element 26. Most of that light is absorbed by the printing element 26 and is not reflected back into the viewing aperture 21, thus providing a distinctive contrast between the photovoltaic device wafer 16 and the printing element 26. Portions of the lower surface of the printing element adjacent the edge of the photovoltaic device wafer 16 have thereon one or more fiducial marks that have a distinctive design and recognizable orientation. Those regions of the printing element are not used for printing a conductive pattern on the wafer. The fiducial marks reflect the light back into the viewing aperture 21. Thereby creating an image which indicates the positional relationship of the printing element 26 with respect to the edge of the photovoltaic device wafer 16.

The ultraviolet light that is reflected back into the viewing aperture 21 by either the fiducial marks of the printing element 26 or the surface of the photovoltaic device wafer 16 travels downward directly through the reflector 42 into the camera 50. Specifically the reflected light traveling from the viewing aperture 21 through the reflector is transmitted by the narrow band-pass filter 54 which also has a coating that is anti-reflective to the ultraviolet wavelengths produced by the light source 36.

The ultraviolet light entering the camera 50 enables that device to produce an image of the wafer and the adjacent portion of the printing element 26. That image is conveyed to the controller 34 along with the images from the other three camera modules 32 associated with the other viewing apertures 22-24 in the platen 12. The controller 34 then employs conventional machine vision techniques to determine the positions of the photovoltaic device wafer 16 and the printing element 26 relative to each viewing aperture 21-24 and uses those collective positions to determine the orientation of the printing element 26 with respect to the photovoltaic device wafer 16. The controller 34 then activates the positioning mechanism 28 to move the printing element 26 along the X and Y axes as necessary to properly position the printing element over the photovoltaic device wafer 16 in order to print a conductive pattern that is properly registered with the photovoltaic devices.

The use of ultraviolet light provides greater contrast between the photovoltaic device wafer 16 and the printing element 26. In addition, the various diffusers and reflective surfaces cause the ultraviolet light from source 36 to strike the underside of the photovoltaic device wafer and the printing element at acute angles, thereby decreasing the reflectivity of that light. Although this decreases the reflectivity for both the photovoltaic device wafer 16 and the printing element 26, the decrease is more pronounced for the printing element, thereby enhancing contrast between those elements.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A vision system for determining a positional relationship between a photovoltaic device wafer and a printing element, wherein the photovoltaic device wafer is on a platen that has an aperture there through with an edge of the photovoltaic device wafer extending across the aperture, and wherein the printing element is located on a remote side of the photovoltaic device wafer from the platen, said vision system comprising:
   a source of ultraviolet light;
   a diffuser assembly for diffusing the ultraviolet light from the source, and directing diffused light into the aperture in the platen and toward the photovoltaic device wafer;
   a camera for producing an electrical image from light received from the aperture in the platen, wherein some of the received light was reflected by the photovoltaic device wafer and some of the received light was reflected by the printing element.

2. The vision system as recited in claim 1 wherein the ultraviolet light has a wavelength less than 410 nm.

3. The vision system as recited in claim 1 wherein the ultraviolet light has a wavelength between 365 nm and 410 nm.

4. The vision system as recited in claim 1 wherein walls of the aperture in the platen have a reflective material thereon.

5. The vision system as recited in claim 1 wherein the diffuser assembly comprises a diffuser panel through which the light from the source travels to the aperture.

6. The vision system as recited in claim 1 wherein the diffuser assembly comprises a reflector for directing the light from the source toward the aperture.

7. The vision system as recited in claim 6 wherein the reflector comprises three walls arranged generally in a U-shape with a first opening of the U-shape facing the light source, wherein the reflector has a second opening facing the platen and a third opening facing the camera.

8. The vision system as recited in claim 1 wherein the diffuser assembly comprises a diffuser panel through which the light from the source travels; and a reflector for directing the light from the diffuser panel toward the aperture and comprising three walls arranged generally in a U-shape with an opening facing the diffuser panel.

9. The vision system as recited in claim 1 further comprising a filter located between the platen and the camera, wherein the filter is transparent to the ultraviolet light.

10. The vision system as recited in claim 1 further comprising a window of materials that is transparent to the ultraviolet light and that is located in the aperture in the platen.

11. The vision system as recited in claim 1 further comprising a controller that receives and processes the electrical image to determine positions of the photovoltaic device wafer and the printing element relative to the aperture.

12. A vision system for determining a positional relationship between a photovoltaic device wafer and a printing element, wherein the photovoltaic device wafer is on a platen that has an aperture there through and the printing element is located on a remote side of the photovoltaic device wafer from the platen, the vision system comprises:
   a source which emits ultraviolet light along a path that is transverse to a longitudinal axis of the aperture;
   a diffuser panel located along the path of the light from the source;
   a reflector for directing the light from the diffuser panel toward the aperture; and
   a camera located along the longitudinal axis of the aperture in the platen and producing an electrical image using light received from the aperture, wherein some of the received light was reflected by the photovoltaic device wafer and some of the received light was reflected by the printing element.

13. The vision system as recited in claim 12 wherein the reflector comprises a first wall extending between a second wall and a third wall, and having a first opening between the second and third walls and facing the diffuser panel.

14. The vision system as recited in claim 13 wherein the longitudinal axis of the aperture extends between the second wall and the third wall of the reflector.

15. The vision system as recited in claim 13 wherein the reflector has a second opening facing the aperture and a third opening facing the camera.

16. The vision system as recited in claim 12 wherein the ultraviolet light has a wavelength less than 410 nm.

17. The vision system as recited in claim 12 wherein the ultraviolet light has a wavelength between 365 nm and 410 nm.

18. The vision system as recited in claim 12 wherein walls of the aperture in the platen have a reflective material thereon.

19. The vision system as recited in claim 12 further comprising a filter located between the platen and the camera, wherein the filter is transparent to the ultraviolet light.

20. The vision system as recited in claim 12 further comprising a window of a material that is transparent to the ultraviolet light and that is located in the aperture in the platen.

21. The vision system as recited in claim 12 wherein the reflector comprises three walls arranged generally in a U-shape with a first opening of the U-shape facing the source, wherein the reflector has a second opening facing the platen and a third opening facing the camera.

22. The vision system as recited in claim 12 wherein the camera receives light that is reflected by the photovoltaic device wafer and light that is reflected by the printing element, and the electrical image depicts an edge of the photovoltaic device wafer.

23. The vision system as recited in claim 12 further comprising a controller that receives and processes the electrical image and thereby determines positions of the photovoltaic device wafer and the printing element relative to the aperture.

24. A method for determining a positional relationship between a photovoltaic device wafer on a platen and a printing element on a remote side of the photovoltaic device wafer from the platen, said method comprising:

emitting ultraviolet light from a source, wherein the light travels along a path that is transverse to a longitudinal axis of the aperture;

directing the ultraviolet light from the source through a diffuser assembly;

reflecting the ultraviolet light from the diffuser assembly into an aperture in the platen, and toward the photovoltaic device wafer; and producing an electrical image from light exiting the aperture in the platen, wherein some of the received light was reflected by the photovoltaic device wafer and some of the received light was reflected by the printing element.

25. The method as recited in claim 24 wherein the ultraviolet light has a wavelength between 365 nm and 410 nm.

26. The method as recited in claim 24 wherein directing the ultraviolet light from the source through a diffuser assembly comprises directing the ultraviolet light through a diffuser panel and onto a reflector that directs the ultraviolet light toward the aperture.

27. The method as recited in claim 24 further comprising directing light exiting the aperture through a filter which is transparent to the ultraviolet light.

28. The method as recited in claim 24 wherein reflecting the ultraviolet light from the diffuser assembly comprises reflecting the ultraviolet light with a multi-faceted reflector.

29. The method as recited in claim 24 wherein reflecting the ultraviolet light from the diffuser assembly comprises reflecting the ultraviolet light by a U-shaped reflector having a first opening facing the source, a second opening facing the platen, and a third opening facing the camera.

30. The method as recited in claim 29 further comprising directing the light exiting the aperture in the platen through two of the first, second and third openings in the U-shaped reflector and toward the camera.

31. The method as recited in claim 24 further comprising processing the electrical image to determine positions of the photovoltaic device wafer and the printing element relative to the aperture.

* * * * *